US008749413B2

(12) United States Patent  
Zhu et al.

(10) Patent No.: US 8,749,413 B2  
(45) Date of Patent: Jun. 10, 2014

(54) DIGITAL CORRECTION CIRCUIT FOR A PIPELINED ANALOG-TO-DIGITAL CONVERTER

(71) Applicant: Shanghai Hua Hong NEC Electronics Co., Ltd., Shanghai (CN)

(72) Inventors: Hongwei Zhu, Shanghai (CN); Yanjuan Liu, Shanghai (CN); Min Tang, Shanghai (CN); Guojun Liu, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/836,614

(22) Filed: Mar. 15, 2013

(65) Prior Publication Data

US 2013/0257635 A1 Oct. 3, 2013

(30) Foreign Application Priority Data

Mar. 30, 2012 (CN) .......................... 2012 1 0088427

(51) Int. Cl.  
*H03M 1/06* (2006.01)

(52) U.S. Cl.  
USPC ........................................................ 341/118

(58) Field of Classification Search  
USPC ................... 341/118, 120, 155, 161, 162  
See application file for complete search history.

(56) References Cited

U.S. PATENT DOCUMENTS

| 5,929,796 | A | * | 7/1999 | Opris et al. | 341/120 |
| 6,456,223 | B1 | * | 9/2002 | Yu et al. | 341/161 |
| 6,486,807 | B2 | * | 11/2002 | Jonsson | 341/120 |
| 6,700,524 | B2 | * | 3/2004 | Naka et al. | 341/161 |
| 6,710,732 | B1 | * | 3/2004 | Aude | 341/155 |
| 6,859,387 | B1 | * | 2/2005 | Aude et al. | 365/155 |
| 7,280,064 | B2 | * | 10/2007 | Lin | 341/155 |
| 7,597,975 | B2 | * | 10/2009 | Pettit et al. | 429/413 |
| 7,646,324 | B2 | * | 1/2010 | Matsubayashi | 341/161 |
| 7,719,452 | B2 | * | 5/2010 | Bardsley et al. | 341/131 |
| 2002/0175843 | A1 | * | 11/2002 | Sonkusale et al. | 341/120 |
| 2003/0058150 | A1 | * | 3/2003 | Naka et al. | 341/161 |
| 2013/0187801 | A1 | * | 7/2013 | de Figueiredo et al. | 341/118 |

* cited by examiner

*Primary Examiner* — Linh Nguyen  
(74) *Attorney, Agent, or Firm* — MKG, LLC

(57) ABSTRACT

A digital correction circuit for a pipelined analog-to-digital converter (ADC) is disclosed. Compared to the conventional digital correction circuit which uses adders to perform operations in ADC digital correction part and hence needs a rather long operation time, the digital correction circuit of this invention can reduce the time needed in operations in the finial digital correction circuits and thus can optimize operation time, by allocating the operations to a plurality of pipeline stages of second sub-circuits configured to synchronize digital codes, each of which can perform part of the operations only with NAND gates, NOR gates, phase inverters and D-type flip-flops, without needing to use adders.

3 Claims, 4 Drawing Sheets

DIGITAL CORRECTION CIRCUIT FOR A PIPELINED ANALOG-TO-DIGITAL CONVERTER

CROSS-REFERENCES TO RELATED APPLICATIONS

This application claims the priority of Chinese patent application number 201210088427.2, filed on Mar. 30, 2012, the entire contents of which are incorporated herein by reference.

TECHNICAL FIELD

This invention relates in general to semiconductor integrated circuits, and more particularly, to a digital correction circuit for a pipelined analog-to-digital converter (ADC).

BACKGROUND

A typical pipelined analog-to-digital converter (ADC) includes a plurality of cascaded sub-circuit stages each of which converts a portion of an analog input signal into one or more digital bits. In a pipelined ADC constructed based on 1.5-bit multiplying analog-to-digital converters (MADCs), except for the sub-circuit of a last stage which includes a 2-bit parallel ADC without a redundancy bit, each of the rest sub-circuit stages includes a 1.5-bit MADC which outputs a 2-bit code that may be a significant code "00", "01" or "10", or a redundancy code "11". For this reason, conventional technologies generally further employ a correction circuit for eliminating outputs of redundancy code(s) and thus correcting outputs of the 1.5-bit MADCs.

FIG. 1 shows a redundancy elimination algorithm for correcting outputs of pipelined 1.5-bit MADCs. As illustrated, a totaling of 9 stages of codes are output from the sub-circuits of the pipelined ADC, including a code consisting of bits $D_{18}$ and $D_{17}$ of an upmost stage labeled "stage 9", a code consisting of bits $D_{16}$ and $D_{15}$ of a next stage labeled "stage 8", ..., and a code consisting of bits $D_2$ and $D_1$ of a bottom stage labeled "stage 1". After performing shift-and-add operations to these codes, 10 quantized bits $Q_1, Q_2, \ldots,$ and $Q_{10}$ can be obtained, wherein $C_1, C_2, \ldots,$ and $C_7$ are carry bits of the shift-and-add operations.

FIG. 2 is a schematic illustration of a conventional digital correction circuit for eliminating redundancy bits. As illustrated, this digital correction circuit includes a data alignment circuit formed by interconnecting a number of D-type flip-flops and a shift-and-add circuit consisting of adders. The data alignment circuit can perform different delays to the codes from different stages so as to synchronize them upon their arrival at the shift-and-add circuit. In addition, the adders can perform shift-and-add operations to the codes from different stages and thereby output quantized bits.

In the conventional digital correction circuit for eliminating redundancy bits, as the adders generally require the involvement of a rather great number of gate stages, the operations always require a long operation time.

SUMMARY OF THE INVENTION

The present invention is to provide a digital correction circuit for a pipelined ADC to optimize the operation time.

To achieve the above objective, the present invention provides a digital correction circuit for a pipelined ADC, the pipelined ADC including N stages of first sub-circuits, each of which outputting a 2-bit code, the 2-bit code output by the n-th-stage of first sub-circuit being expressed as $D_{2(N+1-n)}$ and $D_{2(N+1-n)-1}$, where N is an integer greater than 3 and n is an integer satisfying $1 \leq n \leq N$, the digital correction circuit comprising N stages of second sub-circuits, among which: the first-stage of second sub-circuit is configured to receive the 2-bit code $D_{2N}$ and $D_{2N-1}$ output by the first-stage of first sub-circuit; the i-th-stage of second sub-circuit is configured to receive both the 2-bit code $D_{2(N+1-i)}$ and $D_{2(N+1-i)-1}$ output by the i-th-stage of first sub-circuit and an output from the (i−1)-th-stage of second sub-circuit, where is an integer satisfying $2 \leq i \leq N-1$; and the N-th-stage of second sub-circuit is configured to receive $D_2$; wherein the digital correction circuit outputs N+1 quantized bits, including a first quantized bit $Q_1$ that equals to $D_1$ and second to (N+1)-th quantized bits $Q_2$ to $Q_{N+1}$ that are output by the N-th-stage of second sub-circuit, among which:

the quantized bit $Q_{N+1}$ is expressed as $Q_{N+1}=A_{N+1,2}+B_{N+1,2}D_2$, where $A_{N+1,2}$ and $B_{N+1,2}$ are coefficients of an (N−1)-th-stage of intermediate value that is output by the (N−1)-th-stage of second sub-circuit and corresponds to the quantized bit $Q_{N+1}$, coefficients of the respective stages of intermediate values that are output by the respective stages of second sub-circuits and correspond to the quantized bit $Q_{N+1}$ satisfying the following recurrence relations:

$$A_{N+1,m} = \begin{cases} A_{N+1,m+1} + B_{N+1,m+1}D_{2m} & (m = 2, 3, \ldots, N-2) \\ D_{2N} + D_{2N-1}D_{2N-2} & (m = N-1) \end{cases}$$

$$B_{N+1,m} = \begin{cases} B_{N+1,m+1}\overline{D_{2m}}D_{2m-1} & (m = 3, 4, \ldots, N-2) \\ B_{N+1,3}D_3 & (m = 2) \\ D_{2N-1}\overline{D_{2N-2}}D_{2N-3} & (m = N-1); \end{cases}$$

the quantized bit $Q_k$ is expressed as $Q_k=A_{k,2}\overline{D}_2+B_{k,2}+E_{k,2}D_2$, where k is an integer satisfying $3 \leq k \leq N$, $A_{k,2}, B_{k,2},$ and $E_{k,2}$ are coefficients of an (N−1)-th-stage of intermediate value that is output by the (N−1)-th-stage of second sub-circuit and corresponds to the quantized bit $Q_k$, coefficients of the respective stages of intermediate values that are output by the respective stages of second sub-circuits and correspond to the quantized bit $Q_k$ satisfying the following recurrence relations:

$$A_{k,m} = \begin{cases} D_{2m+1}\overline{D_{2m}} & (m = k-1) \\ A_{k,m+1}\overline{D_{2m}} & (m = 2, 3, \ldots k-2) \end{cases}$$

$$B_{k,m} = \begin{cases} D_{2m+1}\overline{D_{2m}}\ \overline{D_{2m-1}} + \overline{D_{2m+1}}D_{2m} & (m = k-1) \\ A_{k,m+1}\overline{D_{2m}}\ \overline{D_{2m-1}} + B_{k,m+1} + E_{k,m+1}D_{2m} & (m = 2, 3, \ldots k-2) \end{cases}$$

$$E_{k,m} = \begin{cases} \overline{D_{2m+1}}\ \overline{D_{2m}}D_{2m-1} & (m = k-1) \\ E_{k,m+1}\overline{D_{2m}}D_{2m-1} & (m = 3, 4, \ldots k-2) \\ E_{k,3}D_3 & (m = 2); \end{cases}$$

and
the quantized bit $Q_2$ is expressed as $Q_2=D_3\overline{D}_2+\overline{D}_3D_2$.

In one embodiment, N is 9.

In one embodiment, each stage of second sub-circuit is consisted of NAND gates, NOR gates, phase inverters and D-type flip-flops.

Compared to the conventional digital correction circuit that uses adders to perform the shift-and-add operations and hence needs a rather long operation time, the digital correction circuit according to the present invention is able to reduce the operation time and thus optimize the operation time, by allocating the operations to a plurality of stages of second sub-circuits configured to synchronize digital codes, wherein each of the second sub-circuits can perform part of the operations only with NAND gates, NOR gates, phase inverters and D-type flip-flops, without needing to use adders.

BRIEF DESCRIPTION OF THE DRAWINGS

To provide a more complete understanding of the present invention, reference is made to the following description on exemplary embodiments, taken in conjunction with the accompanying drawings, in which.

DETAILED DESCRIPTION

A digital correction circuit for a pipelined ADC employing the present invention will be described in details below with reference to an exemplary embodiment in which the pipelined ADC includes 9 stages of first sub-circuits and the digital correction circuit includes 9 stages of second sub-circuits.

Figure 3:
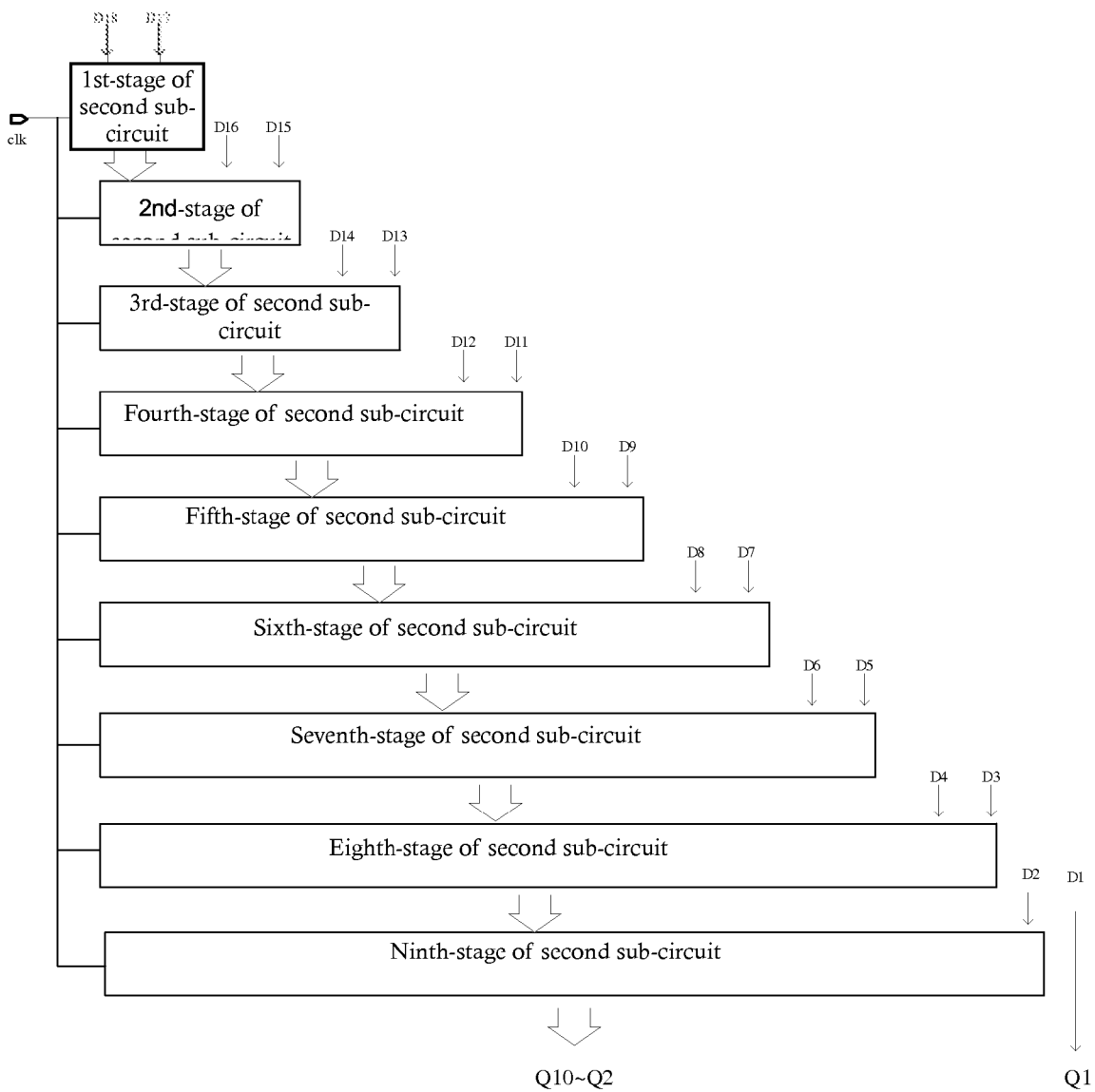
FIG. 3 is a schematic diagram illustrating a digital correction circuit for a pipelined ADC according to an embodiment of the present invention.

FIG. 3 is a schematic diagram illustrating a digital correction circuit for a pipelined ADC according to an embodiment of the present invention. The pipelined ADC may include N (N is an integer and equals to 9 in this exemplary embodiment) stages of first sub-circuits, among which, the last stage of first sub-circuit includes a 2-bit parallel ADC that outputs a 2-bit code, $D_2$ and $D_1$, without any redundancy bits; each of the rest stages of first sub-circuits includes a 1.5-bit MADC which outputs a 2-bit code that may be a significant code "00", "01" or "10", or a redundancy code "11". Bits of a code output by the n-th-stage of first sub-circuit can be expressed as $D_{2(N+1-n)}$ and $D_{2(N+1-n)-1}$, wherein n is an integer that satisfies $1 \leq n \leq N$. That is, as illustrated in FIG. 3, the first-stage of first sub-circuit outputs a code consisting of bits $D_{18}$ and $D_{17}$; the second-stage of first sub-circuit outputs a code consisting of bits $D_{16}$ and $D_{15}$; . . . ; and the ninth-stage of first sub-circuit outputs a code consisting of bits $D_2$ and $D_1$.

Moreover, the digital correction circuit may include N (N is an integer and equals to 9 in this exemplary embodiment) stages of second sub-circuits. As illustrated in FIG. 3, in the exemplary embodiment, these second sub-circuits are indicated as a first-stage of second sub-circuit, a second-stage of second sub-circuit, . . . , and a ninth-stage of second sub-circuit. Each of these second sub-circuits may include one or more NAND gates, one or more NOR gates, one or more phase inverters and one or more D-type flip-flops, but does not include adders.

The first-stage of second sub-circuit is configured to receive a code consisting of two bits $D_{2N}$ and $D_{2N-1}$ (i.e., $D_{18}$ and $D_{17}$ in the exemplary embodiment) from the first-stage of first sub-circuit. Additionally, the i-th-stage of second sub-circuit is configured to both receive a 2-bit code consisting of bits $D_{2(N+1-i)}$ and $D_{2(N+1-i)-1}$ output by the i-th-stage of first sub-circuit and receive an output of the (i−1)-th-stage of second sub-circuit, where i is an integer that satisfies $2 \leq i \leq N-1$. Moreover, the N-th-stage of second sub-circuit is configured to receive a code $D_2$.

The digital correction circuit outputs N+1 (i.e., 10 in the exemplary embodiment) quantized bits $Q_1, Q_2, \ldots,$ and $Q_{N+1}$, among which the first quantized bit $Q_1$ equals to $D_1$ and the second to the (N+1)-th bits $Q_2$ to $Q_{N+1}$ are output by the N-th-stage of second sub-circuit.

More specifically, the quantized bit $Q_{N+1}$ is expressed as $Q_{N+1}=A_{N+1,2}+B_{N+1,2}D_2$, where $A_{N+1,2}$ and $B_{N+1,2}$ are coefficients of an (N−1)-th-stage of intermediate value that is output by the (N−1)-th-stage of second sub-circuit and corresponds to the quantized bit $Q_{N+1}$. Assume the coefficients of an (N−2)-th-stage of intermediate value that is output by the (N−2)-th-stage of second circuit and corresponds to the quantized bit $Q_{N+1}$ are expressed as $A_{N+1,3}$ and $B_{N+1,3}$, the coefficients of an (N−3)-th-stage of intermediate value that is output by the (N−3)-th-stage of second circuit and corresponds to the quantized bit $Q_{N+1}$ are expressed as $A_{N+1,4}$ and $B_{N+1,4}, \ldots,$ and the coefficients of a second-stage of intermediate value that is output by the second-stage of second circuit and corresponds to the quantized bit $Q_{N+1}$ are expressed as $A_{N+1,N-1}$ and $B_{N+1,N-1}$, coefficients of the respective stages of intermediate values that are output by the respective stages of second sub-circuits and correspond to the quantized bit $Q_{N+1}$ satisfy the following recurrence relations:

$$A_{N+1,m} = \begin{cases} A_{N+1,m+1} + B_{N+1,m+1}D_{2m} & (m = 2, 3, \ldots, N-2) \\ D_{2N} + D_{2N-1}D_{2N-2} & (m = N-1) \end{cases}$$

$$B_{N+1,m} = \begin{cases} B_{N+1,m+1}\overline{D_{2m}}D_{2m-1} & (m = 3, 4, \ldots, N-2) \\ B_{N+1,3}D_3 & (m = 2) \\ D_{2N-1}\overline{D_{2N-2}}D_{2N-3} & (m = N-1), \end{cases}$$

where, $A_{N+1,m}$ and $B_{N+1,m}$ are coefficients of the (N+1−m)-th-stage of intermediate value that is output by the (N+1−m)-th-stage of second sub-circuit and corresponds to the quantized bit $Q_{N+1}$.

Moreover, the quantized bit $Q_k$ is expressed as $Q_k=A_{k,2}\overline{D_2}+B_{k,2}\overline{D_2}+E_{k,2}D_2$, where, k is an integer satisfying $3 \leq k \leq N$; $A_{k,2}$, $B_{k,2}$, and $E_{k,2}$ are coefficients of an (N−1)-th-stage of intermediate value that is output by the (N−1)-th-stage of second sub-circuit and corresponds to the quantized bit $Q_k$; and coefficients of the respective stages of intermediate values that are output by the respective stages of second sub-circuits and correspond to the quantized bit $Q_k$ satisfy the following recurrence relations:

$$A_{k,m} = \begin{cases} D_{2m+1}\overline{D_{2m}} & (m = k-1) \\ A_{k,m+1}\overline{D_{2m}} & (m = 2, 3, \ldots k-2) \end{cases}$$

$$B_{k,m} = \begin{cases} D_{2m+1}\overline{D_{2m}}\,\overline{D_{2m-1}} + \overline{D_{2m+1}}D_{2m} & (m = k-1) \\ A_{k,m+1}\overline{D_{2m}}\,\overline{D_{2m-1}} + B_{k,m+1} + E_{k,m+1}D_{2m} & (m = 2, 3, \ldots k-2) \end{cases}$$

$$E_{k,m} = \begin{cases} \overline{D_{2m+1}}\,\overline{D_{2m}}D_{2m-1} & (m = k-1) \\ E_{k,m+1}\overline{D_{2m}}D_{2m-1} & (m = 3, 4, \ldots k-2) \\ E_{k,3}D_3 & (m = 2), \end{cases}$$

where, $A_{k,m}$, $B_{k,m}$ and $E_{k,m}$ are coefficients of the (N+1−m)-th-stage of intermediate value that is output by the (N+1−m)-th-stage of second sub-circuit and corresponds to the quantized bit $Q_k$.

Furthermore, the quantized bit $Q_2$ is expressed as $Q_2 = D_3\overline{D}_2 + \overline{D}_3 D_2$.

It is obvious from the foregoing description that, compared to the conventional digital correction circuit, the digital correction circuit according to the above exemplary embodiment of the present invention is able to optimize operation time without using any adders or sacrificing its function of eliminating the redundancy code "11", by allocating the operations to a plurality of stages of second sub-circuits configured to synchronize digital codes.

The aforementioned coefficients may be calculated according to a method described below.

Figure 1:
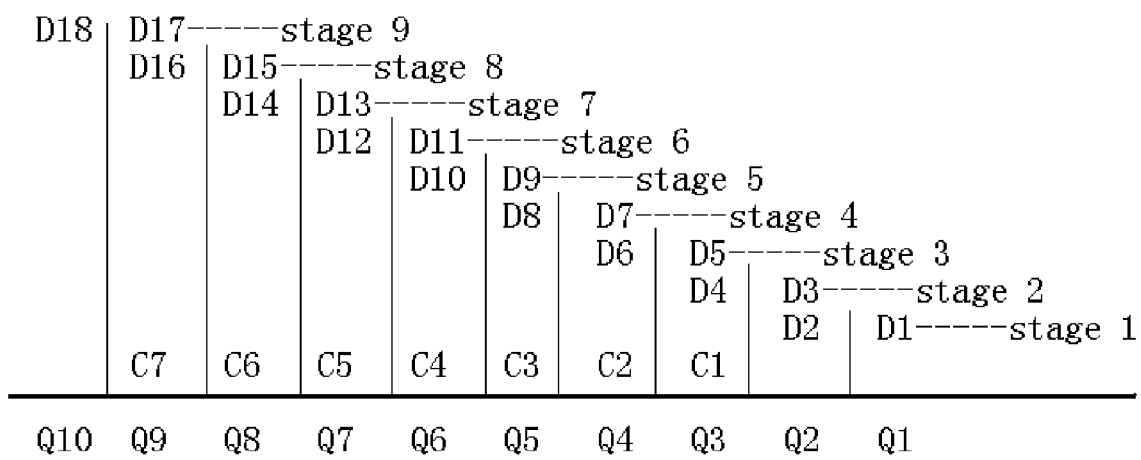
FIG. 1 shows a redundancy elimination algorithm for correcting outputs of pipelined 1.5-bit MADCs.
Figure 2:
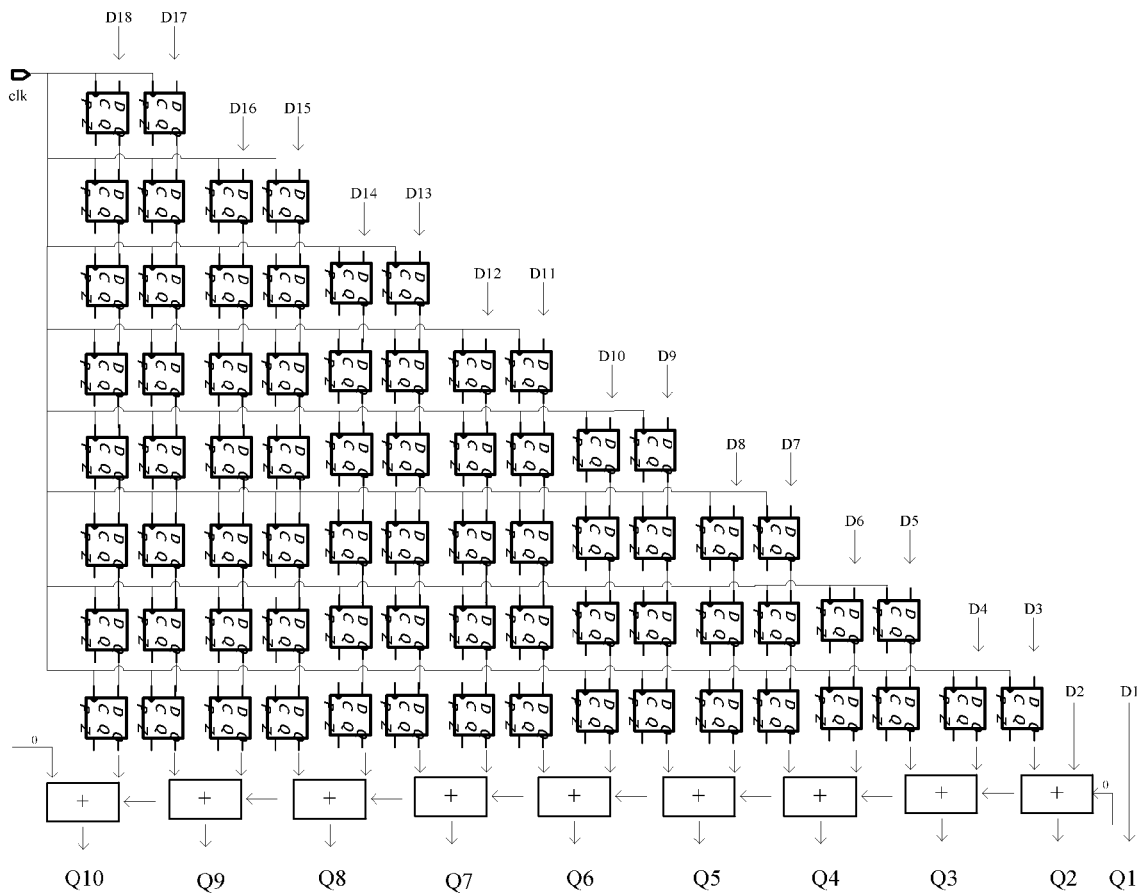
FIG. 2 is a schematic illustration of a conventional digital correction circuit for eliminating redundancy bits.

As possible digital outputs for a 1.5-bit MADC are "00", "10" and "01" only and do not include "11", in the shift-and-add operations shown in FIG. 1, the carry bit $C_i$ (i=1, 2, ..., 7) will definitely be "0" in the case that the bit $D_{2i+2}$ is "1". That is, it is never a case that the bits $C_i$ and $D_{2i+2}$ are "1" at the same time. Further, $C_i$ will be "1" only when the code "$D_{2i+2}D_{2i+1}$" is "01" and at the same one of the bits $D_{2i}$ and $C_{i-1}$ is "1". Therefore, the carry bit $C_i$ can be expressed as $$C_i = \begin{cases} \overline{D}_{2i+2} D_{2i+1}(D_{2i} + C_{i-1}) & (i = 2, 3, \ldots, 7) \\ D_3 D_2 & (i = 1). \end{cases}$$

In the exemplary embodiment, as the quantized bit $Q_{10}$ output by the ninth stage of second sub-circuit is expressed by the following equation (1):

$$Q_{10} = D_{18} + D_{17}(D_{16} + C_7) \qquad (1),$$

where $D_{18}$ and $D_{17}$ are the 2-bit code input into the first-stage of second sub-circuit, the following equation (2) can be obtained by putting the expression of the carry bit $C_7$ into the equation (1):

$$Q_{10} = D_{18} + D_{17}D_{16} + D_{17}\overline{D}_{16}D_{15}(D_{14} + C_6) \qquad (2).$$

In this equation, as $D_{16}$ and $D_{15}$ are the 2-bit code input into the second-stage of second sub-circuit, the values of $D_{18} + D_{17}D_{16}$ and $D_{17}\overline{D}_{16}D_{15}$ can be obtained from operations performed therein. Thus, the bit $Q_{10}$-related coefficients $A_{10,8}$ and $B_{10,8}$ output from this stage can be obtained:

$$\begin{cases} A_{10,8} = D_{18} + D_{17}D_{16} \\ B_{10,8} = D_{17}\overline{D}_{16}D_{15}. \end{cases}$$

Further, when the coefficients $A_{10,8}$ and $B_{10,8}$ are put into the above equation (2), there can be obtained the following equation (3):

$$Q_{10} = A_{10,8} + B_{10,8}(D_{14} + C_6) \qquad (3)$$

$$= A_{10,8} + B_{10,8}D_{14} + B_{10,8}\overline{D}_{14}D_{13}(D_{12} + C_5).$$

Similarly to the above, as $D_{14}$ and $D_{13}$ are the 2-bit code input into the third-stage of second sub-circuit, the values of $A_{10,8} + B_{10,8}D_{14}$ and $B_{10,8}\overline{D}_{14}D_{13}$ in this equation can be obtained from operations performed therein. Thus, the bit $Q_{10}$-related coefficient $A_{10,7}$ and $B_{10,7}$ output from this stage can be obtained:

$$\begin{cases} A_{10,7} = A_{10,8} + B_{10,8}D_{14} \\ B_{10,7} = B_{10,8}\overline{D}_{14}D_{13}. \end{cases}$$

In this way, when m is defined as (N+1-n), the bit $Q_{10}$-related coefficients $A_{10,m}$ and $B_{10,m}$ output from the respective stages of second sub-circuits can be calculated as $$A_{10,m} = A_{10,m+1} + B_{10,m+1}D_{2m} \quad (m = 2, 3, \ldots 7)$$

$$B_{10,m} = \begin{cases} B_{10,m+1} \overline{D}_{2m}D_{2m+1} & (m = 3, 4, \ldots 7) \\ B_{10,3}D_3 & (m = 2). \end{cases}$$

Accordingly, the bit $Q_{10}$ can be calculated as $$Q_{10} = A_{10,2} + B_{10,2}D_2.$$

In addition, as the carry bit $C_i$ (i=1, 2, ..., 7) and the bit $D_{2i+2}$ will never be "1" at the same time, the quantized bit $Q_9$ output by the ninth stage of second sub-circuit can be expressed as the following equation (4):

$$Q_9 = D_{17}\overline{(D_{16} + C_7)} + \overline{D}_{17}(D_{16} + C_7) \qquad (4)$$

$$= D_{17}\overline{D}_{16}\,\overline{D}_{14}\,\overline{C}_6 + D_{17}\overline{D}_{16}\,\overline{D}_{15} + \overline{D}_{17}D_{16} +$$

$$\overline{D}_{17}\,\overline{D}_{16}D_{15}(D_{14} + C_6).$$

In this equation, as $D_{16}$ and $D_{15}$ are the 2-bit code input into the second-stage of second sub-circuit, the values of $D_{17}\overline{D}_{16}$, $D_{17}\overline{D}_{16}\overline{D}_{15} + \overline{D}_{17}D_{16}$ and $\overline{D}_{17}\overline{D}_{16}D_{15}$ can be obtained from operations performed therein. Thus, the bit $Q_9$-related coefficients $A_{9,8}$, $B_{9,8}$ and $E_{9,8}$ output from this stage can be obtained:

$$\begin{cases} A_{9,8} = D_{17}\overline{D}_{16} \\ B_{9,8} = D_{17}\overline{D}_{16}\,\overline{D}_{15} + \overline{D}_{17}D_{16} \\ E_{9,8} = \overline{D}_{17}\,\overline{D}_{16}D_{15}. \end{cases}$$

Further, after putting the coefficient $A_{9,8}$, $B_{9,8}$ and $E_{9,8}$ into the above equation (4), there can be obtained:

$$Q_9 = A_{9,8}\overline{D}_{14}\,\overline{C}_6 + B_{9,8} + E_{9,8}(D_{14} + C_6)$$

$$= A_{9,8}\overline{D}_{14}\,\overline{D}_{12}\,\overline{C}_5 + A_{9,8}\overline{D}_{14}\,\overline{D}_{13} + B_{9,8} + E_{9,8}D_{14} +$$

$$E_{9,8}\overline{D}_{14}D_{13}(D_{12} + C_5).$$

Similarly to the above, as $D_{14}$ and $D_{13}$ are the 2-bit code input into the third-stage of second sub-circuit, the values of $A_{9,8}\overline{D}_{14}$, $A_{9,8}\overline{D}_{14}\overline{D}_{13} + B_{9,8} + E_{9,8}D_{14}$ and $E_{9,8}\overline{D}_{14}D_{13}$ in this equation can be obtained from operations performed therein. Thus, the bit $Q_9$-related coefficients $A_{9,7}$, $B_{9,7}$ and $E_{9,7}$ output from this stage can be obtained:

$$\begin{cases} A_{9,7} = A_{9,8}\overline{D}_{14} \\ B_{9,7} = A_{9,8}\overline{D}_{14}\,\overline{D}_{13} + B_{9,8} + E_{9,8}D_{14} \\ E_{9,7} = E_{9,8}\overline{D}_{14}\,D_{13}. \end{cases}$$

In this way, when m is defined as m=N+1-n, the bit $Q_9$-related coefficients $A_{9,m}$, $B_{9,m}$ and $E_{9,m}$ output by the n-th-stage of second sub-circuit can be calculated as $$A_{9,m} = A_{9,m+1}\overline{D_{2m}} \quad (m = 2, 3, \ldots 7)$$

$$B_{9,m} = A_{9,m+1}\overline{D_{2m}}\,\overline{D_{2m-1}} + B_{9,m+1} + E_{9,m+1}D_{2m} \quad (m = 2, 3, \ldots 7)$$

$$E_{9,m} = \begin{cases} E_{9,m+1}\overline{D_{2m}}D_{2m-1} & (m = 3, 4, \ldots 7) \\ E_{9,3}D_3 & (m = 2); \end{cases}$$

Accordingly, the quantized bit $Q_9$ output by the ninth-stage of second sub-circuit can be calculated as $$Q_9 = A_{9,2}\overline{D_2} + B_{9,2} + E_{9,2}D_2.$$

Following the same process for calculating the quantized bit $Q_9$, when m is defined as m=N+1-n, the bit $Q_k$-related (k=3, 4, ..., 8) coefficients $A_{k,m}$, $B_{k,m}$ and $E_{k,m}$ output by the n-th-stage of second sub-circuit can be calculated as $$A_{k,m} = \begin{cases} D_{2m+1}\overline{D_{2m}} & (m = k-1) \\ A_{k,m+1}\overline{D_{2m}} & (m = 2, 3, \ldots k-2) \end{cases}$$

$$B_{k,m} = \begin{cases} D_{2m+1}\overline{D_{2m}}\,\overline{D_{2m-1}} + \overline{D_{2m+1}}D_{2m} & (m = k-1) \\ A_{k,m+1}\overline{D_{2m}}\,\overline{D_{2m-1}} + B_{k,m+1} + E_{k,m+1}D_{2m} & (m = 2, 3, \ldots k-2) \end{cases}$$

$$E_{k,m} = \begin{cases} \overline{D_{2m+1}}\,\overline{D_{2m}}D_{2m-1} & (m = k-1) \\ E_{k,m+1}\overline{D_{2m}}D_{2m-1} & (m = 3, 4, \ldots k-2) \\ E_{k,3}D_3 & (m = 2), \end{cases}$$

and thus the quantized bit $Q_k$ output by the ninth stage of second sub-circuit can be calculated as $$Q_k = A_{k,2}\overline{D_2} + B_{k,2} + E_{k,2}D_2.$$

Furthermore, the quantized bit $Q_2$ output by the ninth stage of second sub-circuit can be calculated as $$Q_2 = D_3\overline{D_2} + \overline{D_3}D_2,$$

and the quantized bit $Q_1$ is given value $D_1$.

Figure 4:
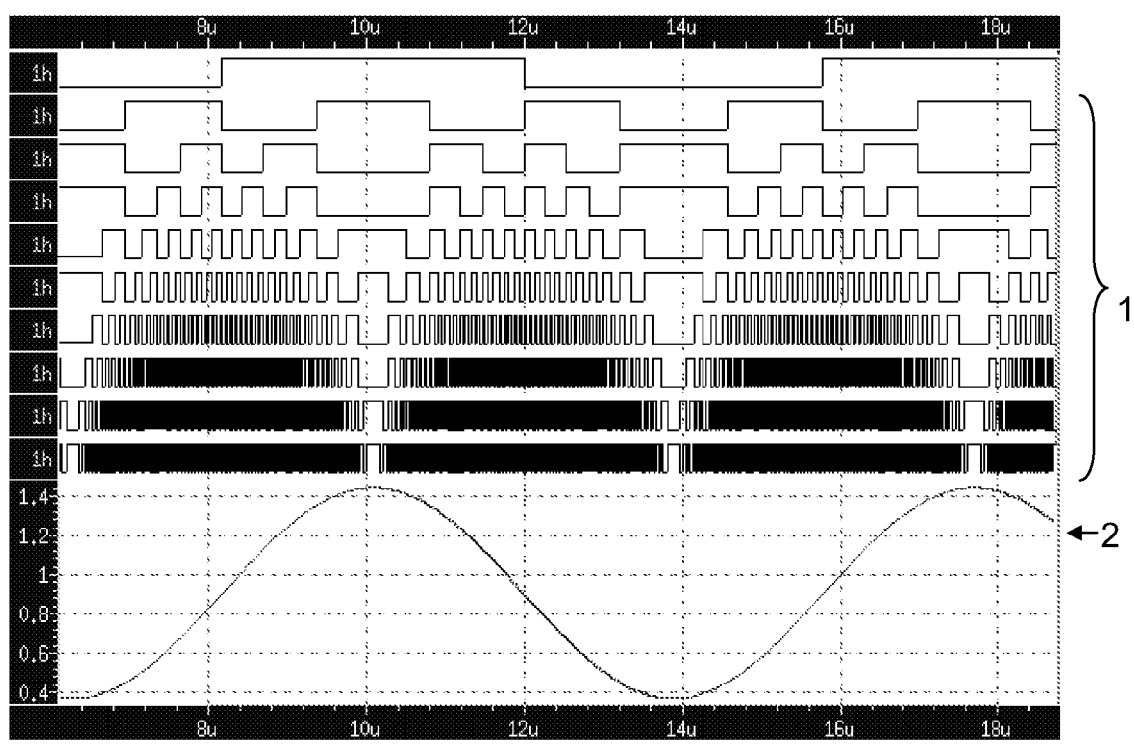
FIG. 4 shows curves representing the results of an analog-to-digital conversion performed by a pipelined ADC incorporating the digital correction circuit according to an embodiment of the present invention.

FIG. 4 shows curves representing the results of an analog-to-digital conversion performed by a pipelined ADC incorporating the digital correction circuit of the exemplary embodiment. As illustrated, when an input is a 1.3215 MHz sine signal sampled at a frequency of 192 MHz, the digital correction circuit can correctly digitalize the input signal to 10 quantized bits expressed by the upper 10 curves collectively indicated by reference number 1 in FIG. 4. As the sine signal can be recovered from the quantized bits using an ideal digital-to-analog behavioral model, the 10 quantized bits were converted to a sine signal expressed by the curve indicated by reference number 2 using an appropriate digital-to-analog converter in order to verify the correctness of them. As illustrated, the conversion is correct and without issues such as non-monotonicity.

While specific embodiments have been presented in the foregoing description, they are not intended to limit the invention in any way. Those skilled in the art can make various modifications and variations without departing from the scope of the invention. Thus, it is intended that the present invention covers all such modifications and variations.

What is claimed is:

1. A digital correction circuit for a pipelined analog-to-digital converter (ADC), the pipelined ADC including N stages of first sub-circuits, each of which outputting a 2-bit code, the 2-bit code output by the n-th-stage of first sub-circuit being expressed as $D_{2(N+1-n)}$ and $D_{2(N+1-n)-1}$, where N is an integer greater than 3 and n is an integer satisfying $1 \leq n \leq N$, the digital correction circuit comprising N stages of second sub-circuits, among which: the first-stage of second sub-circuit is configured to receive the 2-bit code $D_{2N}$ and $D_{2N-1}$ output by the first-stage of first sub-circuit; the i-th-stage of second sub-circuit is configured to receive both the 2-bit code $D_{2(N+1-i)}$ and $D_{2(N+1-i)-1}$ output by the i-th-stage of first sub-circuit and an output from the (i−1)-th-stage of second sub-circuit, where i is an integer satisfying $2 \leq i \leq N-1$; and the N-th-stage of second sub-circuit is configured to receive $D_2$;

wherein the digital correction circuit outputs N+1 quantized bits, including a first quantized bit $Q_1$ that equals to $D_1$ and second to (N+1)-th quantized bits $Q_2$ to $Q_{N+1}$ that are output by the N-th-stage of second sub-circuit, among which:

the quantized bit $Q_{N+1}$ is expressed as $Q_{N+1} = A_{N+1,2} + B_{N+1,2}D_2$, where $A_{N+1,2}$ and $B_{N+1,2}$ are coefficients of an (N−1)-th-stage of intermediate value that is output by the (N−1)-th-stage of second sub-circuit and corresponds to the quantized bit $Q_{N+1}$, coefficients of the respective stages of intermediate values that are output by the respective stages of second sub-circuits and correspond to the quantized bit $Q_{N+1}$ satisfying the following recurrence relations:

$$A_{N+1,m} = \begin{cases} A_{N+1,m+1} + B_{N+1,m+1}D_{2m} & (m = 2, 3, \ldots, N-2) \\ D_{2N} + D_{2N-1}D_{2N-2} & (m = N-1) \end{cases}$$

$$B_{N+1,m} = \begin{cases} B_{N+1,m+1}\overline{D_{2m}}D_{2m-1} & (m = 3, 4, \ldots, N-2) \\ B_{N+1,3}D_3 & (m = 2) \\ D_{2N-1}\overline{D_{2N-2}}D_{2N-3} & (m = N-1) \end{cases}$$

the quantized bit $Q_k$ is expressed as $Q_k = A_{k,2}\overline{D_2} + B_{k,2} + E_{k,2}D_2$ where k is an integer satisfying $3 \leq k \leq N$, $A_{k,2}$, $B_{k,2}$, and $E_{k,2}$ are coefficients of an (N−1)-th-stage of intermediate value that is output by the (N−1)-th-stage of second sub-circuit and corresponds to the quantized bit $Q_k$, coefficients of the respective stages of intermediate values that are output by the respective stages of second sub-circuits and correspond to the quantized bit $Q_k$ satisfying the following recurrence relations:

$$A_{k,m} = \begin{cases} D_{2m+1}\overline{D_{2m}} & (m = k-1) \\ A_{k,m+1}\overline{D_{2m}} & (m = 2, 3, \ldots k-2) \end{cases}$$

$$B_{k,m} = \begin{cases} D_{2m+1}\overline{D_{2m}}\,\overline{D_{2m-1}} + \overline{D_{2m+1}}D_{2m} & (m = k-1) \\ A_{k,m+1}\overline{D_{2m}}\,\overline{D_{2m-1}} + B_{k,m+1} + E_{k,m+1}D_{2m} & (m = 2, 3, \ldots k-2) \end{cases}$$

$$E_{k,m} = \begin{cases} \overline{D_{2m+1}}\,\overline{D_{2m}}D_{2m-1} & (m = k-1) \\ E_{k,m+1}\overline{D_{2m}}D_{2m-1} & (m = 3, 4, \ldots k-2) \\ E_{k,3}D_3 & (m = 2); \end{cases}$$

and the quantized bit $Q_2$ is expressed as $Q_2 = D_3\overline{D_2} + \overline{D_3}D_2$.

2. The digital correction circuit according to claim 1, wherein N is 9.

3. The digital correction circuit according to claim 1, wherein each stage of second sub-circuit is consisted of NAND gates, NOR gates, phase inverters and D-type flip-flops.

* * * * *